(12) United States Patent
Tsurunari et al.

(10) Patent No.: US 8,704,612 B2
(45) Date of Patent: Apr. 22, 2014

(54) ANTENNA SHARING DEVICE

(75) Inventors: Tetsuya Tsurunari, Osaka (JP); Rei Goto, Osaka (JP); Hiroyuki Nakamura, Osaka (JP)

(73) Assignee: Panasonic Corporation, Osaka (JP)

( * ) Notice: Subject to any disclaimer, the term of this patent is extended or adjusted under 35 U.S.C. 154(b) by 294 days.

(21) Appl. No.: 13/319,578

(22) PCT Filed: May 10, 2010

(86) PCT No.: PCT/JP2010/003154
§ 371 (c)(1),
(2), (4) Date: Nov. 9, 2011

(87) PCT Pub. No.: WO2010/131450
PCT Pub. Date: Nov. 18, 2010

(65) Prior Publication Data
US 2012/0062337 A1    Mar. 15, 2012

(30) Foreign Application Priority Data
May 14, 2009    (JP) ................................ 2009-117468

(51) Int. Cl.
H03H 9/00    (2006.01)
H03H 9/64    (2006.01)

(52) U.S. Cl.
USPC .......................................... 333/133; 333/195

(58) Field of Classification Search
USPC ........................... 333/133, 193, 194, 195, 196
See application file for complete search history.

(56) References Cited

U.S. PATENT DOCUMENTS

| 6,246,302 | B1   | 6/2001 | Muller et al. |
| 7,345,400 | B2 * | 3/2008 | Nakao et al. ............... 310/313 A |
| 7,538,636 | B2 * | 5/2009 | Takayama et al. ............ 333/193 |
| 7,589,606 | B2 * | 9/2009 | Takayama et al. ............ 333/193 |

(Continued)

FOREIGN PATENT DOCUMENTS

| CN | 1400684 A | 3/2003 |
| CN | 1253042 C | 4/2006 |

(Continued)

OTHER PUBLICATIONS

International Search Report for Application No. PCT/JP2010/003154, Jun. 15, 2010, Panasonic Corporation.
Chinese Office Action issued in corresponding Application No. 201080020711.5, dated Oct. 11, 2013.

*Primary Examiner* — Dean O Takaoka
(74) *Attorney, Agent, or Firm* — RatnerPrestia (57) ABSTRACT

The antenna sharing device has a first elastic-wave filter for passing signals of a first frequency passband and a second elastic-wave filter for passing signals of a second frequency passband higher than the first frequency passband. The first elastic-wave filter is a ladder-type filter including a first series resonator and a second series resonator having an antiresonant frequency point higher than that of the first series resonator. The first series resonator has a first IDT electrode and a first dielectric film covering the electrode. The second series resonator has a second IDT electrode and a second dielectric film covering the electrode. The first and the second dielectric films have a first projection and a second projection, respectively, so as to be formed above the electrode fingers of each IDT electrode. The cross-sectional area of the first projection of the first series resonator is larger than that of the second projection of the second series resonator in the excitation direction of the elastic wave. The structure satisfies both of steepness in a crossband and low loss in a passband.

8 Claims, 7 Drawing Sheets

(56) References Cited

U.S. PATENT DOCUMENTS

| | | |
|---|---|---|
| 8,072,293 B2 * 12/2011 | Nakamura et al. | 333/133 |
| 2003/0025572 A1 2/2003 | Maekawa et al. | |
| 2004/0027213 A1 2/2004 | Takata | |
| 2008/0067891 A1 3/2008 | Matsuda et al. | |
| 2010/0164646 A1 7/2010 | Nakanishi et al. | |
| 2012/0032753 A1 * 2/2012 | Nishimura et al. | 333/133 |
| 2012/0086521 A1 * 4/2012 | Tsurunari et al. | 333/133 |

FOREIGN PATENT DOCUMENTS

| | | |
|---|---|---|
| EP | 2 058 946 A1 | 5/2009 |
| JP | 07-154199 A | 6/1995 |
| JP | 2001-500697 A | 1/2001 |
| JP | 2005-191797 A | 7/2005 |
| JP | 2008-078739 A | 4/2008 |
| WO | WO 2007/094368 A1 | 8/2007 |
| WO | WO 2008/059780 A1 | 5/2008 |

* cited by examiner

ANTENNA SHARING DEVICE

This Application is a U.S. National Phase Application of PCT International Application PCT/JP2010/003154.

TECHNICAL FIELD

The present invention relates to an antenna sharing device having a transmit filter and a receive filter.

BACKGROUND ART

An antenna sharing device generally has two types of filters—a transmit filter and a receive filter—for separating signals of the transmitting passband from signals of the receiving passband that is adjacent to the higher side of the transmitting passband. The transmit filter is generally formed of a ladder type filter where series resonators and parallel resonators are connected in a ladder structure.

In Band 2 of the W-CDMA standard, the band spacing between the transmitting passband and the receiving passband (i.e. the crossband) is determined to be 20 MHz. In an antenna sharing device that copes with such a narrow crossband above, steepness in attenuation characteristics in the crossband between the transmitting passband and the receiving passband is significantly effective in ensuring isolation of transmitting signals and receiving signals. Specifically, what is needed is steepness in attenuation characteristics in frequencies higher than the passband of the transmit filter and steepness in attenuation characteristics in frequencies lower than the passband of the receive filter.

To improve the steepness in attenuation characteristics in frequencies higher than the passband of the transmit filter, a suggestion has introduced a technique in which weighed IDT electrodes are employed for the resonator of the transmit filter.

According to the conventional antenna sharing device, however, increase in steepness in attenuation characteristics has brought the following problems. In the transmit filter, increasing the steepness in attenuation characteristics in frequencies higher than the passband increases loss in the transmitting passband. Similarly, in the receive filter, increasing the steepness in attenuation characteristics in frequencies lower than the passband increases loss in the receiving passband.

As described above, the pending problem of the conventional antenna sharing device is to satisfy both of properly steep attenuation characteristics in a crossband and low loss in a passband.

As a related art patent literature preceding the present invention, patent literature 1 is known, for example.

CITATION LIST

Patent Literature

PTL 1

Japanese Unexamined Patent Application Publication No. 2001-500697

SUMMARY OF THE INVENTION

The antenna sharing device of the present invention has a first elastic wave filter for passing a signal of a first frequency band and a second elastic wave filter for passing a signal of a second frequency band that is higher than the first frequency band. The first elastic wave filter has a ladder type filter including a first series resonator and a second series resonator that has an antiresonant frequency point higher than that of the first series resonator. The first series resonator has a first IDT (interdigital transducer) electrode having a plurality of electrode fingers, and a first dielectric film that covers the first IDT electrode. The first dielectric film has a first projection above each electrode finger. Similarly, the second series resonator has a second IDT electrode having a plurality of electrode fingers, and a second dielectric film that covers the second IDT electrode. The second dielectric film has a second projection above each electrode finger. The cross-sectional area of the first projection in the excitation direction of the elastic wave of the first series resonator is larger than the cross-sectional area of the second projection in the excitation direction of the elastic wave of the second series resonator.

Such structured first elastic wave filter allows the first series resonator to have an electromechanical coupling factor smaller than that of the second series resonator. The first series resonator has an antiresonant frequency lower than that of the second series resonator, which largely contributes to steepened attenuation characteristics on the high-frequency side of the first elastic wave filter. Therefore, determining the electromechanical coupling factor of the first series resonator to be relatively small increases steepness in attenuation characteristics in a crossband (on the high-frequency side of the first elastic wave filter). On the other hand, the second series resonator has an antiresonant frequency higher than that of the first series resonator, which largely contributes to low loss in the passband of the first elastic wave filter. Therefore, determining the electromechanical coupling factor of the second series resonator to be relatively large achieves low loss in the passband.

The antenna sharing device of the present invention has a first elastic wave filter for passing a signal of a first frequency band and a second elastic wave filter for passing a signal of a second frequency band that is higher than the first frequency band. The second elastic wave filter has a ladder type filter including a first parallel resonator and a second parallel resonator that has an antiresonant frequency point lower than that of the first parallel resonator. The first parallel resonator has a third IDT electrode having a plurality of electrode fingers, and a third dielectric film that covers the third IDT electrode. The third dielectric film has a third projection above each electrode finger. Similarly, the second parallel resonator has a fourth IDT electrode having a plurality of electrode fingers, and a fourth dielectric film that covers the fourth IDT electrode. The fourth dielectric film has a fourth projection above each electrode finger. The cross-sectional area of the third projection in the excitation direction of the elastic wave of the first parallel resonator is larger than the cross-sectional area of the fourth projection in the excitation direction of the elastic wave of the second parallel resonator.

Such structured second elastic wave filter allows the first parallel resonator to have an electromechanical coupling factor smaller than that of the second parallel resonator. The first parallel resonator has an antiresonant frequency higher than that of the second parallel resonator, which largely contributes to steepened attenuation characteristics on the low-frequency side of the second elastic wave filter. Therefore, determining the electromechanical coupling factor of the first parallel resonator to be relatively small increases steepness in attenuation characteristics in a crossband (on the low-frequency side of the second elastic wave filter). On the other hand, the second parallel resonator has an antiresonant frequency lower than that of the first parallel resonator, which largely contributes to low loss in the passband of the second elastic wave filter. Therefore, determining the electrome-

DESCRIPTION OF EMBODIMENTS

Hereinafter, exemplary embodiments of the present invention will be described with reference to the accompanying drawings. The present invention is not limited to the structure described in the embodiments.

First Exemplary Embodiment

Figure 1:
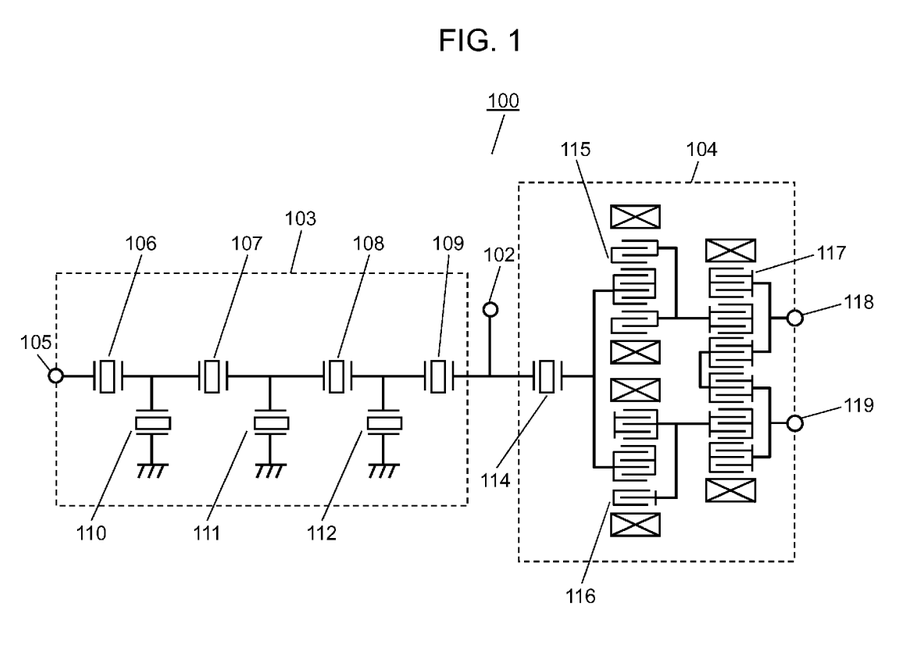
FIG. 1 is a schematic circuit diagram of the antenna sharing device in accordance with a first exemplary embodiment.

FIG. 1 is a schematic circuit diagram of the antenna sharing device in accordance with the first exemplary embodiment. Specifically, the antenna sharing device is compliant with Band 2 of the W-CDMA (Wideband Code Division Multiple Access) standard.

Antenna sharing device 100 of FIG. 1 has first elastic wave filter 103 as a transmit filter and second elastic wave filter 104 as a receive filter, both of which are connected to antenna terminal 102.

In Band-2 antenna sharing device 100, for example, first elastic wave filter 103 allows passage of signals in a transmitting band of 1.85 GHz-1.91 GHz (hereinafter, a first frequency band). Second elastic wave filter 104 allows passage of signals in a receiving band of 1.93 GHz-1.99 GHz (hereinafter, a second frequency band) that is higher than the first frequency band.

Hereinafter, first elastic wave filter 103 and second elastic wave filter 104 will be described in detail.

First elastic wave filter 103 is a ladder type filter where a plurality of resonators is disposed in a ladder structure. To be specific, first elastic wave filter 103 has receiving terminal 105, series resonator 106, series resonator 107, series resonator 108, and series resonator 109. The aforementioned series resonators are connected in series between receiving terminal 105 and antenna terminal 102. First elastic wave filter 103 further contains parallel resonator 110, parallel resonator 111, and parallel resonator 112. Parallel resonator 110 is disposed between series resonator 106 and series resonator 107 so as to be connected to ground in parallel. Parallel resonator 111 is disposed between series resonator 107 and series resonator 108 so as to be connected to ground in parallel. Parallel resonator 112 is disposed between series resonator 108 and series resonator 109 so as to be connected to ground in parallel.

Second elastic wave filter 104 has series resonator 114 connected to antenna terminal 102, and multimode elastic filters 115, 116, 117. Multimode elastic wave filters 115 and 116 have a branching connection to series resonator 114. Multimode elastic wave filter 117 has a cascade connection to multimode elastic wave filters 115 and 116. Second elastic wave filter 104 further contains receiving terminals 118 and 119 that are connected to multimode elastic wave filter 117. Received signals are fed from receiving terminals 118 and 119 as balanced output.

Figure 2:
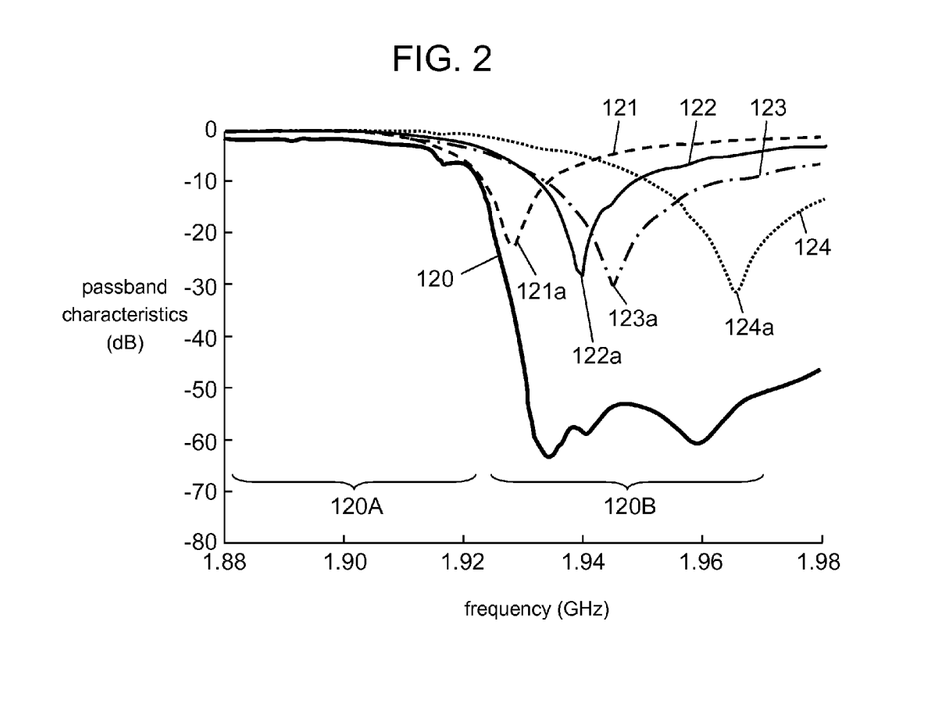
FIG. 2 shows passband characteristics of the antenna sharing device in accordance with the first exemplary embodiment.

Passband characteristics of first elastic wave filter 103 is described with reference to FIG. 2. FIG. 2 shows the passband characteristics (in dB) on the high-frequency side of the first frequency band (i.e. approx. between 1.88 GHz-1.98 GHz) of the antenna sharing device of the embodiment. In FIG. 2, the passband characteristics of first elastic wave filter 103 is represented by characteristics curve 120. First elastic wave filter 103 is a ladder type filter in which resonators are disposed in a series arm and a parallel arm. In the structure above, attenuation characteristics in crossband 120B, which is higher in frequencies than passband 120A, is mainly determined by the antiresonant frequency of a resonator disposed in the series arm.

FIG. 2 shows passband characteristics of the antenna sharing device in accordance with the first exemplary embodiment. In FIG. 2, characteristics curves 121, 122, 123, and 124 show passband characteristics of series resonators 106, 107, 108, and 109, respectively. Each of characteristics curves 121, 122, 123, and 124 has a different antiresonant frequency point: point 121a, point 122a, point 123a, and point 124a shown in FIG. 2. The attenuation characteristics of first elastic wave filter 103 (represented by characteristics curve 120) in crossband 120B is formed by passband characteristics of series resonators 106, 107, 108, and 109 combined with each other.

Characteristics curve 120 has a gradient at the boundary of passband 120A and crossband 120B, which is referred to steepness. As the steepness increases, attenuation in a crossband increases, which ensures isolation of the transmitting band and the receiving band in antenna sharing device 100. In the description below, difference between the frequency at a passband characteristic of −3 dB and the frequency at a passband characteristic of −50 dB is represented by a degree of steepness as a steepness indicator.

According to characteristics curve 120 of first elastic wave filter 103, the frequency corresponding to a passband characteristic of −3 dB is 1.910 GHz, and the frequency corresponding to a passband characteristic of −50 dB is 1.928 GHz. That is, degree of steepness is 18 MHz. The degree of steepness is not necessarily used for a steepness indicator; an index representing magnitude of gradient between a passband and a blocking band of a filter may be employed.

FIG. 2 apparently shows that the passband characteristics of series resonator 106 (represented by characteristics curve 121) largely contributes to the steepness on the high-frequency side of characteristics curve 120 of first elastic wave filter 103. Series resonator 106, which has the lowest antiresonant frequency in the series resonators forming first elastic wave filter 103, has the greatest contribution to the steepness on the high-frequency side of characteristics curve 120 of first elastic wave filter 103. On the other hand, the series resonator having the highest antiresonant frequency in the series resonators forming first elastic wave filter 103 has the greatest contribution to decreased loss in passband 120A of first elastic wave filter 103.

To properly determine an antiresonant frequency of a resonator formed of piezoelectric material, a method for controlling an electromechanical coupling factor of the resonator is effectively employed. The electromechanical coupling factor is an index that represents conversion efficiency between electrical energy and mechanical energy, which is obtained from a resonant frequency and an antiresonant frequency of a resonator. In a ladder type filter formed of combination of piezoelectric resonators, increasing the electromechanical coupling factor of each resonator allows the ladder type filter to have a narrow passband, contributing to steepened attenuation characteristics. Conversely, decreasing the electromechanical coupling factor of each resonator allows the ladder type filter to have a wide passband, contributing to moderate attenuation characteristics. That is, a proper combination of resonators with different electromechanical coupling factors achieves both the above—properly steepened attenuation characteristics of a ladder type filter and low loss in a passband.

Hereinafter, a method of controlling an electromechanical coupling factor of a piezoelectric resonator will described with reference to FIGS. 3 through 7.

Figure 3:
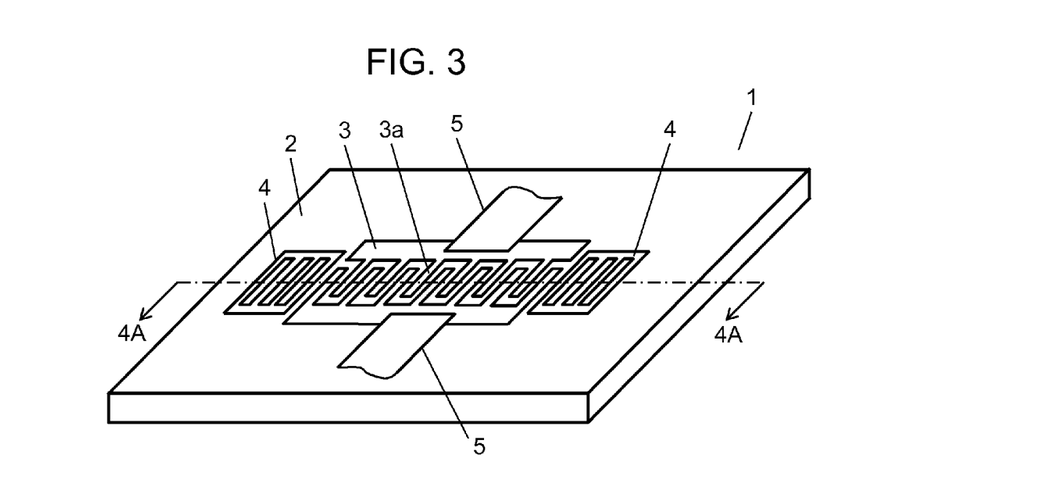
FIG. 3 is an exploded view of a resonator in accordance with the first exemplary embodiment.

FIG. 3 is an exploded view of the resonator in accordance with the embodiment. Resonator 1 has piezoelectric substrate 2 made of, for example, lithium tantalate and lithium niobate, and IDT (Inter Digital Transducer) electrode 3 formed on piezoelectric substrate 2. IDT electrode 3 has a plurality of electrode fingers 3a. Resonator 1 further has a pair of reflectors 4 disposed on the both ends of IDT electrode 3 in the excitation direction of the elastic wave, and signal line 5. One end of signal line 5 is electrically connected to IDT electrode 3, and the other end is electrically connected to another IDT electrode or an electrode of a receiving terminal, for example. In resonator 1, piezoelectric substrate 2, IDT electrode 3, reflectors 4, signal line 5 are covered with dielectric film 6 (not shown in FIG. 3).

Figure 4A:
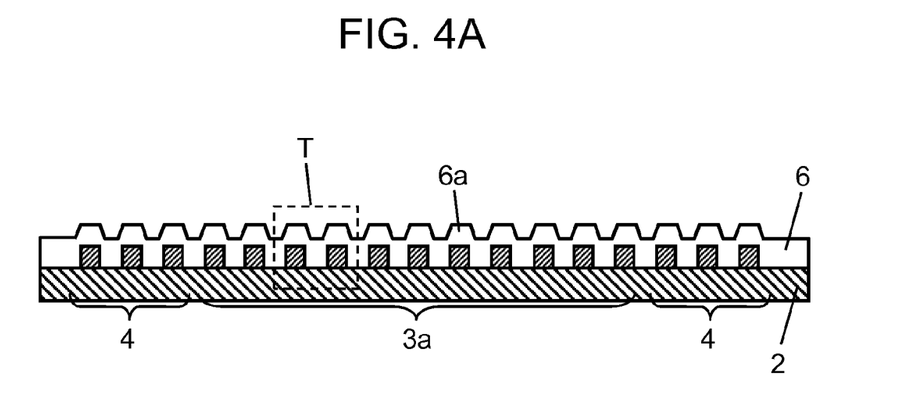
FIG. 4A is a sectional view of the resonator taken along the line 4A-4A of FIG. 3 in accordance with the first exemplary embodiment.

FIG. 4A is a sectional view of the resonator taken along the line 4A-4A of FIG. 3 in accordance with the first exemplary embodiment. As shown in FIG. 4A, piezoelectric substrate 2, IDT electrode 3, reflectors 4, signal line 5 are covered with dielectric film 6. Dielectric film 6 protects piezoelectric substrate 2 and IDT electrode 3 from entry of foreign matters, enhancing reliability of resonance characteristics of resonator 1.

Besides, employing $SiO_2$ (silicon dioxide) for dielectric film 6 improves frequency-temperature characteristics of resonator 1. Piezoelectric material forming piezoelectric substrate 2, such as lithium tantalate and lithium niobate, has negative frequency-temperature characteristics. In contrast, silicon dioxide has positive frequency-temperature characteristics. Therefore, when resonator 1 is structured in a manner that $SiO_2$-made dielectric film 6 is laminated with a proper thickness on piezoelectric substrate 2, the resonator as a whole structure has frequency-temperature characteristics close to "zero".

Further, forming dielectric film 6 so as to have projections 6a above electrode fingers 3a suppresses generation of a spurious signal in passband 120A of resonator 1. That is, controlling the shape of the projection allows Rayleigh wave as the cause for spurious signals to have an electromechanical coupling factor close to zero. For example, in a process of forming $SiO_2$ film as a dielectric film, projection 6a of dielectric film 6 is formed by sputtering with application of bias voltage to the substrate.

Figure 4B:
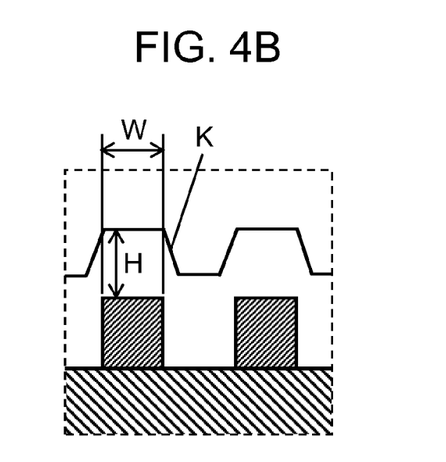
FIG. 4B is an enlarged view of the T section shown in FIG. 4A.

FIG. 4B is an enlarged view of the T section—where projection 6a is formed above each of electrode fingers 3a—shown in FIG. 4A. Hereinafter, the shape of projection 6a will be described. In the description, H represents the height, W represents the width, and K represents the gradient angle of the projection.

Figure 5:
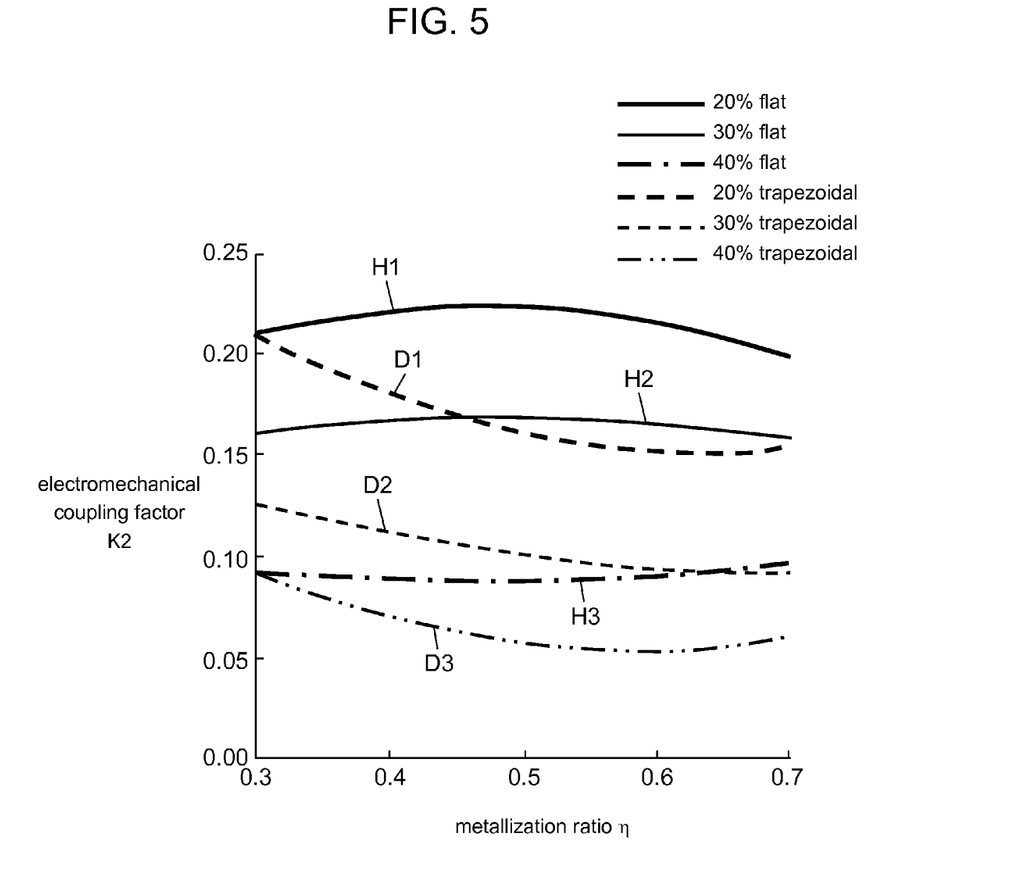
FIG. 5 shows an electromechanical coupling factor of the antenna sharing device in accordance with the first exemplary embodiment.

FIG. 5 shows an electromechanical coupling factor of the antenna sharing device in accordance with the first exemplary embodiment; specifically, it shows relation between a metallization ratio and an electromechanical coupling factor. The metallization ratio is the ratio of the electrode width of electrode finger 3a to the pitch of electrode finger 3a. In FIG. 5, H1, H2, and H3 show relation between the metallization ratio and the electromechanical coupling factor when dielectric film 6 has a flat upper surface. In contrast, D1, D2, and D3 show relation between the metallization ratio and the electromechanical coupling factor when dielectric film 6 has an irregular upper surface so that trapezoidal projection 6a is formed above electrode finger 3a. As the width of projection 6a is substantially equal to that of electrode finger 3a, it increases with increase in metallization ratio. The differences shown by H1, H2, and H3 of FIG. 5 come from difference in thickness of dielectric film 6 (i.e. height H from the top of the electrode to the top of projection 6a). When the first frequency band (as the passband of first elastic wave filter 103a) has a center frequency of 1.88 GHz at wavelength λ, H1 shows the result when the thickness of dielectric film 6 is defined to be 20% of wavelength λ: H=0.2λ. H2 shows the result when H=0.3λ and H3 shows the result when H=0.4λ.

Similarly, D1, D2, and D3 of FIG. 5 show the result when H=0.2λ, H=0.3λ, and H=0.4λ, respectively.

When dielectric film 6 has a flat upper surface, as shown in FIG. 5, as for the electromechanical coupling factor, H1 has the largest value, then H2 comes next, and H3 has the smallest value. The graph shows that the electromechanical coupling factor decreases with increase in thickness of dielectric film 6. That is, controlling the thickness of dielectric film 6 allows resonator 1 to have a properly determined electromechanical coupling factor, i.e., a properly determined antiresonant frequency. In first elastic wave filter 103, for example, determining the thickness of series resonator 106 to be larger than that of series resonator 107 can lower the antiresonant frequency of series resonator 106 than that of series resonator 107.

Determining the electromechanical coupling factor properly by the thickness control of dielectric film 6 is effective in adjusting the antiresonant frequency of the resonator. However, as described earlier, change in thickness of dielectric film 6 inconveniently affects the frequency-temperature characteristics of resonator 1.

Besides, dielectric film 6 having a flat upper surface, i.e., H1, H2, and H3 has a small amount of change in electromechanical coupling factor to metallization ratio, showing nearly flat characteristics. The graph shows difficulty in determining electromechanical coupling factor properly by controlling the metallization ratio.

In dielectric film 6 having trapezoidal projection 6a above electrode finger 3a (shown by D1, D2, and D3), the electromechanical coupling factor decreases with increase in thickness of dielectric film 6. Further, in this case, increasing the metallization ratio decreases the electromechanical coupling factor of resonator 1. Therefore, the electromechanical coupling factor of resonator 1 can be determined properly by controlling the thickness of dielectric film 6. In addition, in the cases of D1, D2, and D3, the electromechanical coupling factor can be also determined properly by controlling the metallization ratio (i.e., width H of projection 6a). Specifically, control of width H of projection 6a means controlling the size of the cross-sectional area of dielectric film 6 in the excitation direction of the elastic wave of resonator 1 (, which is shown by crosshatched part on electrode finger 3a of FIG. 6, and hereinafter referred to as the cross-section area of the projection).

The height of projection 6a is determined to be the same as that of electrode finger 3a; but actually, variations of approx. 10% occur due to constraint in the process of forming dielectric film 6. In a resonator used for the Band-2 antenna sharing device, the height of electrode finger 3a is preferably determined to be 8% of wavelength $\lambda$, for example, approx. 160 nm. In that case, considering variations above, projection 6a has a height of approx. 160 nm±10%.

FIG. 6 shows a sectional view of the resonator of the first exemplary embodiment. FIG. 6 illustrates the method of determining the size of the cross-sectional area of projection 6a of dielectric film 6a (shown by the crosshatched part on electrode finger 3a). FIGS. 6A through 6D show broken-line section T of FIG. 4A.

Figure 6A:
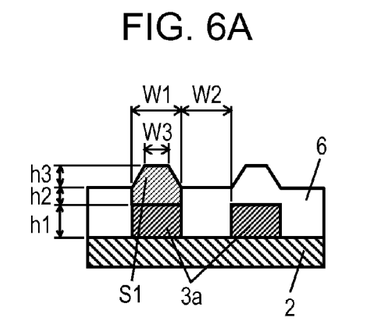
FIG. 6A through FIG. 6D show sectional views of the resonator in accordance with the first exemplary embodiment.

In the case of FIG. 6A, the metallization ratio is calculated by the following expression: $\eta1=w1/(w1+w2)$. The height of the projection measures (h2+h3). Cross-sectional area S1 of the projection is calculated by expression (1) below;

$$S1 = w1 \cdot h2 + (w1+w3) \cdot h3/2 \qquad \text{expression (1).}$$

Figure 6B:
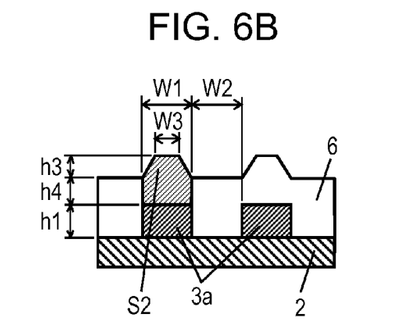

The structure of FIG. 6B has a height of the projection of (h4+h3), which is larger than (h2+h3) in FIG. 6A. Since the height of the projection increases, cross-sectional area S2 becomes larger than cross-sectional area S1, decreasing electromechanical coupling factor than that in FIG. 6A.

Figure 6C:
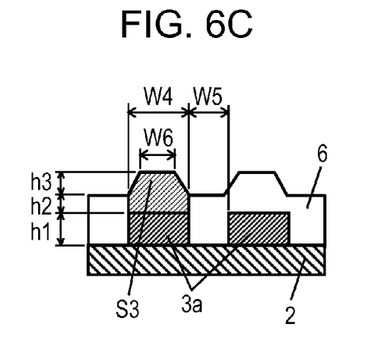

In the structure of FIG. 6C, metallization ratio ($\eta2$) is determined to be larger than $\eta1$ and calculated by the following expression: $\eta2=w4/(w4+w5)$. In that case, too, cross-sectional area S3 becomes larger than cross-sectional area S1, decreasing electromechanical coupling factor than that in FIG. 6A.

Figure 6D:
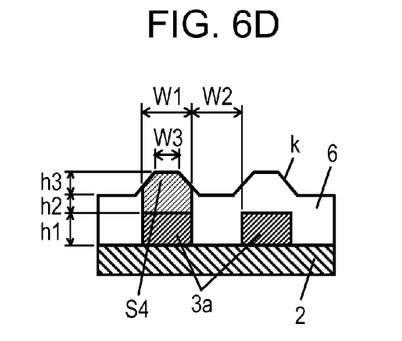

The structure of FIG. 6D has gradient angle K of the projection smaller than that in FIG. 6A. Compared to the case of FIG. 6A, the structure has cross-sectional area S4 of the projection smaller than cross-sectional area S1 and a large electromechanical coupling factor.

As described above, the electromechanical coupling factor of resonator 1 can be controlled by the size of the cross-sectional area of the projection of dielectric film 6. For example, in first elastic wave filter 103, determining the size of the cross-sectional area of the projection of the dielectric film of series resonator 106 to be larger than that of series resonator 107 allows series resonator 106 to have an antiresonant frequency lower than that of series resonator 107.

Dielectric film 6 having trapezoidal projections above electrode fingers 3a has following advantages: low-loss effect in a passband by suppressing Rayleigh wave, and well-controlled electromechanical coupling factor of resonator 1 by determining the size of the cross-sectional area of the projection of dielectric film 6. In particular, when the cross-sectional area of the projection is determined by changing a metallization ratio or gradient angle K, no need for changing the film thickness of dielectric film 6, and therefore no adversely effect on frequency-temperature characteristics of resonator 1.

Figure 7:
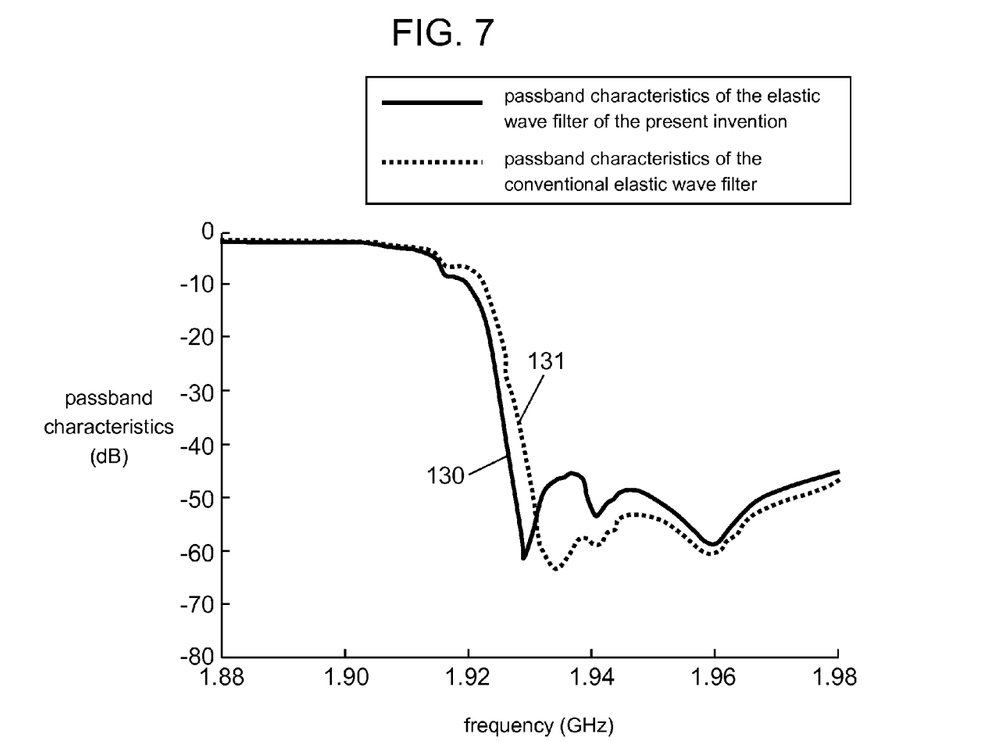
FIG. 7 shows passband characteristics of the antenna sharing device in accordance with the first exemplary embodiment.

FIG. 7 shows passband characteristics of the antenna sharing device in accordance with the first exemplary embodiment. Specifically, FIG. 7 shows the passband characteristics of first elastic wave filter 103 of the embodiment (shown by characteristics curve 130) and the passband characteristics of a conventional elastic wave filter (shown by characteristics curve 131). In the two filters above, the cross-sectional area of the projection of the dielectric film of each of series resonators 107 through 109 is determined to be the same. According to characteristics curve 131 of the conventional elastic wave filter, the frequency corresponding to a passband characteristic of −3 dB is 1.911 GHz, and the frequency corresponding to a passband characteristic of −50 dB is 1.931 GHz. That is, degree of steepness is 20 MHz. First elastic wave filter 103 shows a degree of steepness of 18 MHz, as described earlier. Compared to the conventional structure, the structure of the embodiment has improvements in steepness with an amount of loss in a passband maintained at the same level. That is, the structure of the embodiment allows the antenna sharing device to have improvements in steepness in a crossband and low loss in a passband.

Second Exemplary Embodiment

The structure of the second exemplary embodiment will be described. The description below focuses attention on differences from the structure in the first embodiment.

Figure 8:
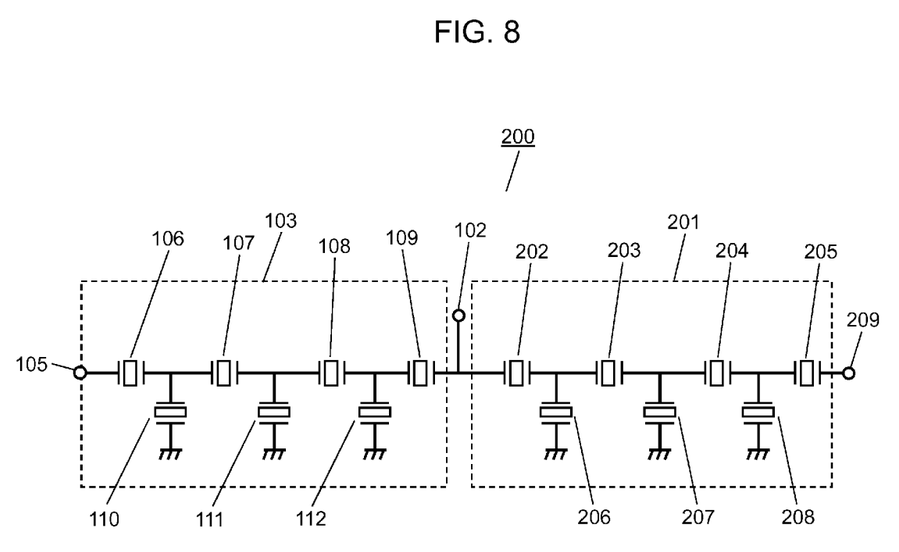
FIG. 8 is a schematic circuit diagram of the antenna sharing device in accordance with a second exemplary embodiment.

FIG. 8 is a schematic circuit diagram of the antenna sharing device in accordance with the second exemplary embodiment.

Antenna sharing device 200 of FIG. 8 has first elastic wave filter 103 as a ladder type transmit filter and second elastic wave filter 201 as a ladder type receive filter.

Second elastic wave filter 201 has series resonator 202, series resonator 203, series resonator 204, and series resonator 205, which are connected in series between antenna terminal 102 and receive terminal 209. Second elastic wave filter 201 further contains parallel resonator 206, parallel resonator 207, and parallel resonator 208. Parallel resonator 206 is disposed between series resonator 202 and series resonator 203 so as to be connected to ground in parallel. Parallel resonator 207 is disposed between series resonator 203 and series resonator 204 so as to be connected to ground in parallel. Parallel resonator 208 is disposed between series resonator 204 and series resonator 205 so as to be connected to ground in parallel.

A second frequency passband, which is the passband of second elastic wave filter 201, is positioned higher than the first frequency passband as the passband of first elastic wave filter 103. To ensure isolation of transmitting signals and receiving signals in antenna sharing device 200, attenuation characteristics on the low-frequency side of the passband of second elastic wave filter 201 needs to have increase in steepness. The increase in steepness can be obtained by determining the resonant frequency of any one of parallel resonators 206, 207, 208 of second elastic wave filter 201 to be close to the passband. As is shown in FIG. 5, increasing the cross-sectional area of the projection of dielectric film 6 in any one of parallel resonators 206, 207, and 208 decreases the electromechanical coupling factor, so that the resonant frequency is approximated to the passband.

The cross-sectional area of the projection of dielectric film 6 of a parallel resonator can be increased by the following methods (as shown in FIGS. 6A through 6D): increasing the height of the projection, increasing the width of the projection by increase in metallization ratio; and increasing the gradient angle K of the projection.

INDUSTRIAL APPLICABILITY

The antenna sharing device of the present invention satisfies both of properly steep attenuation characteristics in a crossband and low loss in a transmission passband. The structure is therefore greatly useful for electronic equipment, for example, mobile phones.

The invention claimed is:

1. An antenna sharing device comprising:
a first elastic wave filter as a ladder-type filter for passing a signal of a first frequency band, the first elastic wave filter including:
   a first series resonator including:
      a first IDT electrode having a plurality of electrode fingers; and
      a first dielectric film that covers the first IDT electrode and has a first projection above the electrode fingers; and
   a second series resonator having an antiresonant frequency point higher than that of the first series resonator, the second series resonator including:
      a second IDT electrode having a plurality of electrode fingers; and
      a second dielectric film that covers the second IDT electrode and has a second projection above the electrode fingers; and
a second elastic wave filter for passing a signal of a second frequency passband that is higher than the first frequency passband,
wherein, the first projection in an excitation direction of an elastic wave of the first series resonator has a cross-sectional area larger than a cross-sectional area of the second projection in an excitation direction of an elastic wave of the second series resonator.

2. The antenna sharing device according to claim 1, wherein the first projection in the excitation direction of the elastic wave of the first series resonator has a width larger than a width of the second projection in the excitation direction of the elastic wave of the second series resonator.

3. The antenna sharing device according to claim 1, wherein the first projection in the excitation direction of the elastic wave of the first series resonator has a height larger than a height of the second projection in the excitation direction of the elastic wave of the second series resonator.

4. The antenna sharing device according to claim 1, wherein the first projection of a trapezoidal shape in the excitation direction of the elastic wave of the first series resonator has a gradient angle larger than a gradient angle of the second projection of a trapezoidal shape in the excitation direction of the elastic wave of the second series resonator.

5. An antenna sharing device comprising:
a first elastic wave filter for passing a signal of a first frequency band; and
a second elastic wave filter as a ladder-type filter for passing a signal of a second frequency band that is higher than the first frequency band, the second elastic wave filter further including:
   a first parallel resonator further including:
      a third IDT electrode having a plurality of electrode fingers; and
      a third dielectric film that covers the third IDT electrode and has a third projection above the electrode fingers; and
   a second parallel resonator having an antiresonant frequency point lower than that of the first parallel resonator, the second parallel resonator further including:
      a fourth IDT electrode having a plurality of electrode fingers; and
      a fourth dielectric film that covers the fourth IDT electrode and has a fourth projection above the electrode fingers,
wherein, the third projection in an excitation direction of an elastic wave of the first parallel resonator has a cross-sectional area larger than a cross-sectional area of the fourth projection in an excitation direction of an elastic wave of the second parallel resonator.

6. The antenna sharing device according to claim 5, wherein the third projection in the excitation direction of the elastic wave of the first parallel resonator has a width larger than a width of the fourth projection in the excitation direction of the elastic wave of the second parallel resonator.

7. The antenna sharing device according to claim 5, wherein the third projection in the excitation direction of the elastic wave of the first parallel resonator has a height larger than a height of the fourth projection in the excitation direction of the elastic wave of the second parallel resonator.

8. The antenna sharing device according to claim 5, wherein the third projection of a trapezoidal shape in the excitation direction of the elastic wave of the first parallel resonator has a gradient angle larger than a gradient angle of the fourth projection of a trapezoidal shape in the excitation direction of the elastic wave of the second parallel resonator.

* * * * *